(12) United States Patent
Liu et al.

(10) Patent No.: US 7,314,796 B2
(45) Date of Patent: Jan. 1, 2008

(54) METHODS FOR REDUCING WORDLINE SHEET RESISTANCE

(75) Inventors: Hung-Wei Liu, Hsinchu (TW); Hsueh-Hao Shih, Hsinchu (TW); Szu-Yu Wang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 345 days.

(21) Appl. No.: 11/015,154

(22) Filed: Dec. 17, 2004

(65) Prior Publication Data
US 2006/0134863 A1    Jun. 22, 2006

(51) Int. Cl.
*H01L 21/336* (2006.01)
(52) U.S. Cl. .......... 438/257; 257/E21.68; 257/E21.694
(58) Field of Classification Search ........ 438/257–267; 257/314–320, E21.679, E21.68, E21.681, 257/E21.694
See application file for complete search history.

(56) References Cited

U.S. PATENT DOCUMENTS

| 5,529,943 A | | 6/1996 | Hong et al. | |
|---|---|---|---|---|
| 5,714,412 A | * | 2/1998 | Liang et al. | 438/266 |
| 5,888,588 A | * | 3/1999 | Nagabushnam et al. | 438/655 |
| 6,177,345 B1 | | 1/2001 | Morales et al. | |
| 6,211,074 B1 | * | 4/2001 | Huang et al. | 438/257 |
| 6,551,878 B2 | | 4/2003 | Clampitt et al. | |
| 2003/0119257 A1 | * | 6/2003 | Dong et al. | 438/257 |
| 2003/0203574 A1 | | 10/2003 | Kim et al. | |

* cited by examiner

*Primary Examiner*—Brook Kebede
(74) *Attorney, Agent, or Firm*—Knobbe, Martens, Olson & Bear LLP

(57) ABSTRACT

The present invention is directed to forming memory wordlines having a relatively lower sheet resistance. In one embodiment, a control-gate poly layer including a first and a second poly-Si portion is deposited. a The first poly-Si portion is deposited on a semiconductor substrate using a first precursor gas flow rate. A The second poly-Si portion is deposited on the first poly-Si portion using a second precursor gas flow rate, where the second precursor flow rate higher than the first precursor gas flow rate. A tungsten silicide layer is then deposited. A wordline is formed from a stacked film of the control-gate poly layer and tungsten silicide layer. The control-gate poly layer and tungsten silicide layer are then patterned to form a gate electrode, and a implantation process is made, after or before, forming the tungsten silicide layer.

35 Claims, 6 Drawing Sheets

FIG. 3A

| Stacked film 600Å P-doped poly silicon and 900Å WSix | | Rs (ohm/sq) | Rs Reduction (%) |
|---|---|---|---|
| P-doped poly silicon | WSix | | |
| Conventional one-step process | WF6—3.8 sccm | 74.8 | - |
| Two-step process | | 71.6 | 4.28 |

FIG. 3B

| Stacked film 600Å P-doped poly silicon and 900Å WSix | | P170 KeV/5.5E15 cm implantation | Rs (ohm/sq) | Rs Reduction (%) |
|---|---|---|---|---|
| P-doped poly silicon | WSix | | | |
| Conventional one-step process | WF6—3.8 sccm | Without | 24.1 | - |
| Conventional one-step process | | Without | 22.7 | 5.81 |
| Two-step process | | With | 18.3 | 24.07 |

METHODS FOR REDUCING WORDLINE SHEET RESISTANCE

BACKGROUND OF THE INVENTION

1. Field of the Invention

The present invention relates to wordlines, and in particular to methods of reducing wordline sheet resistance.

2. Description of the Related Art

In a typical flash or EEPROM memory array, the memory cells are arranged in a rectangular array of rows and columns to form intersections at which there are disposed memory cell transistors. The drain of each transistor is connected to a corresponding bit line, the source of each transistor is connected to an array source voltage by an array source line, and the gate of each transistor is connected to a wordline.

Tungsten has been used for wordline applications in semiconductor memory. However, the associated sheet resistance is conventionally not as low as may be desired for certain applications.

SUMMARY OF THE INVENTION

The present invention relates to methods and systems for reducing sheet resistance via the modification of poly-Si portions and tungsten-silicide (WSix, where x can be, for example 1 or 2) films with additional implantation. By way of example, the wordlines can be associated with a non-volatile semiconductor memory circuit, such as a flash or EEPROM memory device, or a volatile semiconductor memory circuit.

In one embodiment, a control-gate poly layer including a first and a second poly-Si portion is deposited. A first poly-Si portion is deposited on a semiconductor substrate using a first precursor gas flow rate. A second poly-Si portion is deposited using a second precursor gas flow rate, where the second precursor flow rate higher than the first precursor gas flow rate. A tungsten silicide layer is deposited on said control-gate poly layer. The control-gate poly layer and tungsten silicide layer are then patterned to form a gate electrode, and a wordline is formed from a stacked film of said control-gate poly layer and tungsten silicide layer. The gate electrode is implanted after or before depositing the tungsten silicide layer.

One example embodiment is a method of forming a memory wordline, the method comprising: forming a first gate dielectric; forming a charge storage layer on the first gate dielectric; forming a second dielectric layer on the charge storage layer; depositing a first poly-Si portion using a first gas comprising $PH_3$ with a first $PH_3$ gas flow rate; depositing a second poly-Si portion using the first gas with a second $PH_3$ gas flow rate, the second $PH_3$ gas flow rate higher than the first $PH_3$ gas flow rate; depositing a tungsten silicide layer, wherein the control-gate poly layer and tungsten silicide layer are then patterned to form a gate electrode, and a wordline is formed from a stacked film of said control-gate poly layer and tungsten silicide layer; and implanting the gate electrode.

Another example embodiment is a method to form a wordline, the method comprising: depositing on the semiconductor substrate a first poly-Si portion with a first precursor gas flow rate; depositing a second poly-Si portion on the first poly-Si portion with a second precursor gas flow rate, wherein the second precursor flow rate is higher than the first precursor gas flow rate, and the first and second poly-Si portion constitute a control-gate poly layer; performing gate implantation on the control-gate poly layer using an implantation energy within the range about 30 to 100 KeV; and depositing a WSix layer, wherein a wordline is formed from the control-gate poly layer and WSix layer.

Yet another example embodiment is a method of forming memory a wordline, the method comprising: depositing a first poly-Si portion using a first gas comprising $PH_3$ with a first $PH_3$ gas flow rate; depositing a second poly-Si portion using the first gas with a second $PH_3$ gas flow rate, wherein the second $PH_3$ gas flow rate is higher than the first $PH_3$ gas flow rate, and the first and second poly-Si portion constitute a control-gate poly layer; depositing a WSix layer on the control-gate poly layer, wherein x denotes integer, and the control-gate poly layer and WSix layer are then patterned to form a gate electrode, and a wordline is formed from a stacked film of the control-gate poly layer and WSix layer; and implanting the gate electrode.

BRIEF DESCRIPTION OF THE DRAWINGS

Exemplary embodiments of the present invention are illustrated in the accompanying drawings, which are for illustrative purposes only. The drawings comprise the following figures, in which like numerals indicate like parts.

FIG. 3A is a table providing example wordline sheet resistances and wordline sheet resistance reduction levels, using a conventional poly-Si deposition process and a multiple step poly-Si deposition, with an example WF6 flow rate, before annealing.

FIG. 3B is a table providing example wordline sheet resistances, dose rates, implantation energies, and wordline sheet resistance reduction levels for the embodiments of FIG. 3A, after annealing.

DETAILED DESCRIPTION OF PREFERRED EMBODIMENTS

Figure 1A:
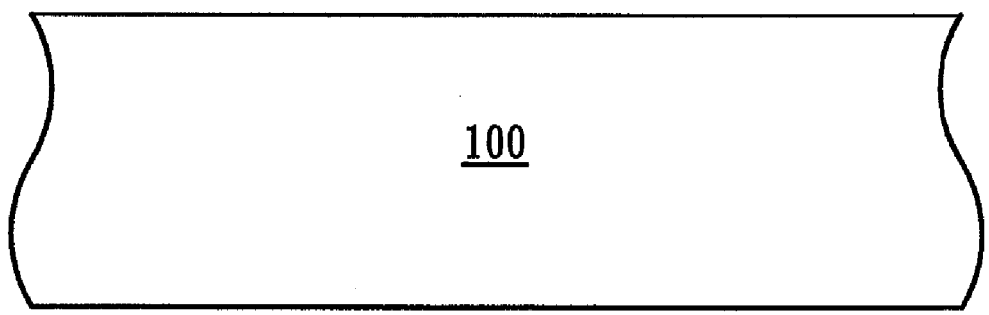
FIGS. 1A-1H illustrate an example cross-section of forming a semiconductor memory cell.

The present invention relates to memory device wordlines, and in particular to methods of reducing sheet resistance via the modification of control-gate poly layer (poly-Si) and tungsten-silicide (WSix) films with additional implantation. By way of example, the wordlines can be associated with a non-volatile semiconductor memory circuit, such as a flash or EEPROM memory device, or a volatile semiconductor memory circuit.

Tungsten-silicide can have one or more advantageous characteristics for use with wordlines, such as having low resistance and low stress.

In particular, in one embodiment, selected processing parameters, including the gas flow of deposition precursors, such as PH3 or WF6, and an additional implantation processes, are used to reduce the wordline sheet resistance. In particular, in one example, the modulation of poly-Si (utilizing an example two-step process described below) and post-WSi deposition implantation reduces wordline sheet resistance about 24%-25%, although greater or lower reductions can optionally be achieved.

While the examples discussed herein relate to memory wordlines for illustrative purposes, embodiments of the present invention is applicable to the formation of other types of interconnects and/or other types of semiconductor devices.

A substrate, which can be for example, a silicon substrate, has well engineering performed to form a well region. The well region can be formed using, for example, a well ion implantation process. In addition, a first gate dielectric is formed thereon. Overlaying the first gate dielectric is a charge storage layer, which can be, for example, a floating-gate-poly layer (poly-Si, high-dose P doped) or other charge trapping materials. The next layer in this example includes a second dielectric layer followed by a control-gate poly layer, the control-gate poly layer includes a first poly-Si portion and a second poly-Si portion.

A WSix layer is deposited using a WSi deposition process. A gate electrode patterning process is then performed, followed by spacer and source/drain engineering, the patterned control-gate poly layer and WSix layer constituting the gate electrode. The WSix layer overlays the control gate layer and forms a low-resistance interface between word-lines deposited in isolation trenches and the control gates. The wordlines can include a stacked film of the control-gate poly layer and the WSix layer.

Example fabrication parameters for the gate electrode, including the first and second poly-Si portions and WSi fabrication processes, are as follows, although other process parameters, including other facilities, process conditions, and/or process steps can be used:

1. Poly-Si Deposition:

(a) Facility: CVD (chemical vapor deposition) including a single-wafer (or multi-wafer) process chamber and a furnace.

(b) Process conditions: 600° C. to 800° C., 0.3 torr to 400 torr, wherein the gas flow rates of SiH4 and PH3 (for P-doped poly-Si) not generally limited. The process time can be 20 sec to 2 hours, although other ranges can be used.

(c) An example "two-step" poly-Si deposition process with increased PH3 gas flow rate is optionally performed, although additional steps can be performed as well.

1st step: deposit the first part of doped poly-Si with a relatively low first PH3 gas flow rate, such as, by way of example, less than 200 sccm, or, in one embodiment, about 80 sccm (standard cubic centimeters per minute).

2nd step: deposit the second part of doped poly-Si overlying the first part of poly-Si using a second gas flow rate. The second gas flow rate and P concentration is relatively higher than for the deposit of the first portion of the doped poly-Si. For example, the gas flow can be about 20 sccm higher than the first PH3 gas flow, such as a gas flow rate of 100 sccm for example, or in one embodiment, less than or equal to 400 sccm, in the second part will be higher than that in first part of poly-Si.

2. WSix Deposition:

(a) Facility: single-wafer (or multi-wafer) CVD chamber.

(b) Process condition: In one example process, the reactants include at least one silane-based gas and one tungsten-based gas.

3. Implantation of the Gate Electrode:

(a) Facility: a variety of implanter-types can be used, including single-wafer or batch type implanters.

(b) Process Conditions:
Dosage: >1.0E14 (cm$^{-2}$), for example a dosage of 5.5E15 can be used.
Energy: from 5 to 200 KeV, or more preferably, 30 to 100 KeV.
Specie: One or more of P, As, B, BF2, In, Ge, Si, etc. For example, one embodiment utilizes P and As.

Optionally, before implantation, an additional screen layer on WSix can also be included, such as about 280 Angstroms using a LPTEOS (Low Pressure Tetraethoxysilane) deposition process.

Figure 1B:
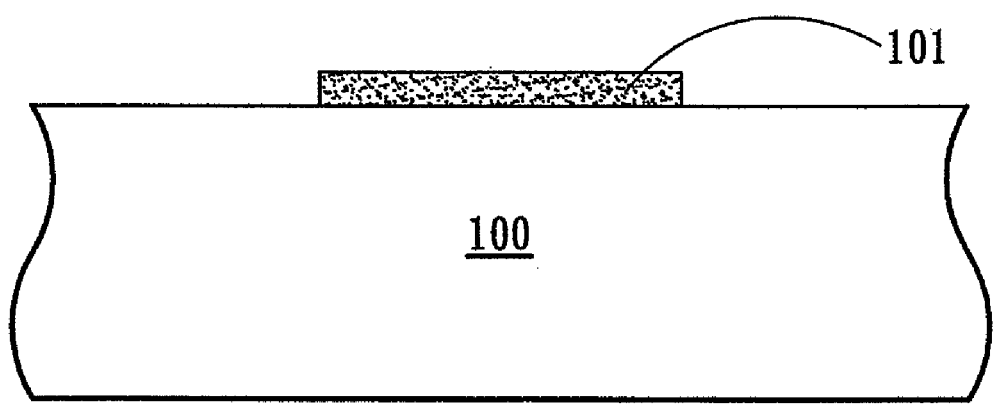
Figure 1C:
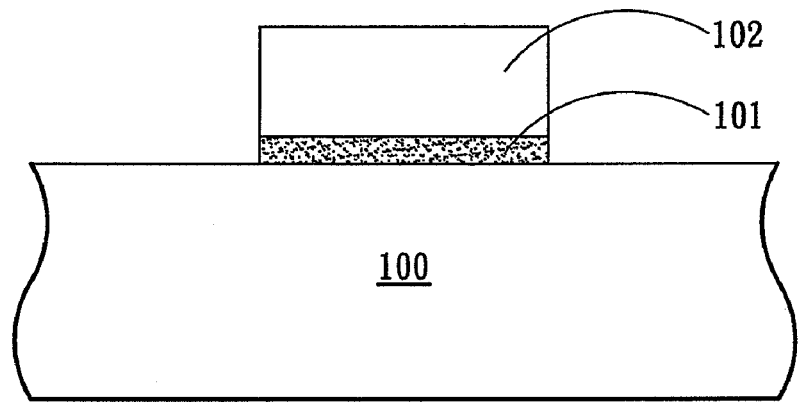
Figure 1D:
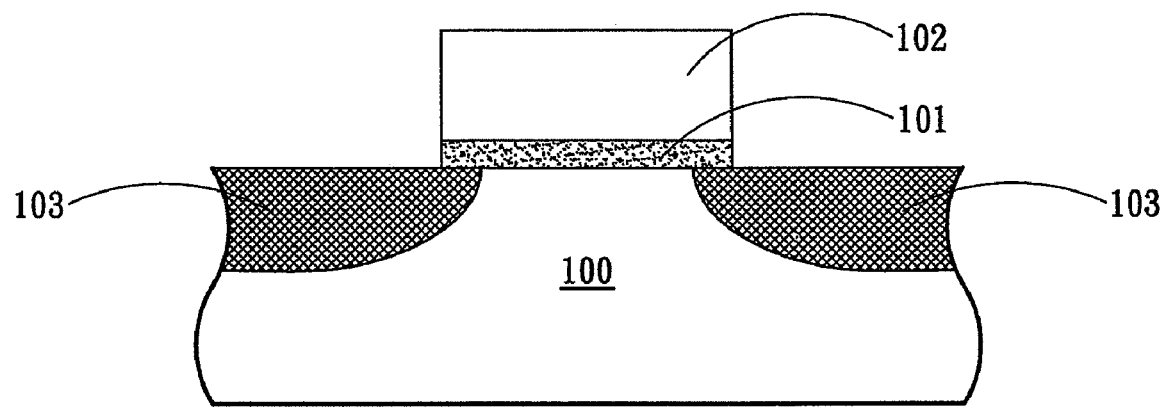
Figure 1E:
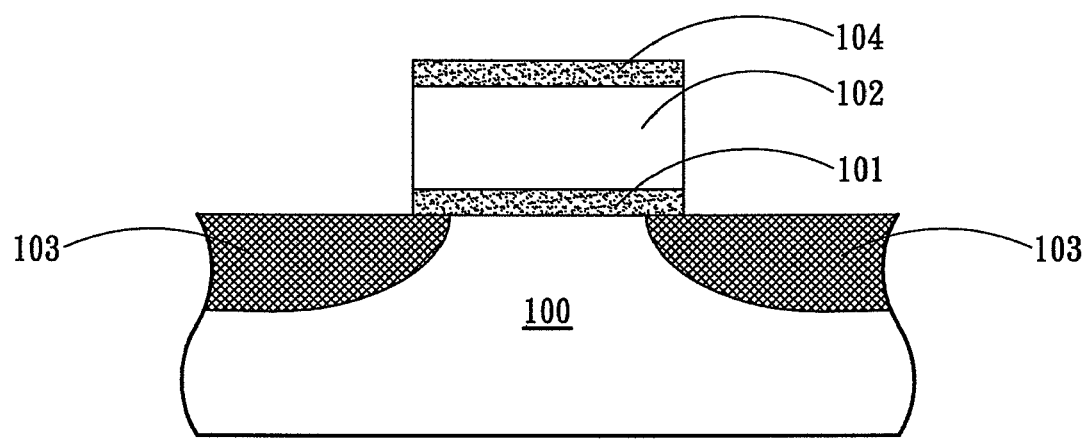
Figure 1F:
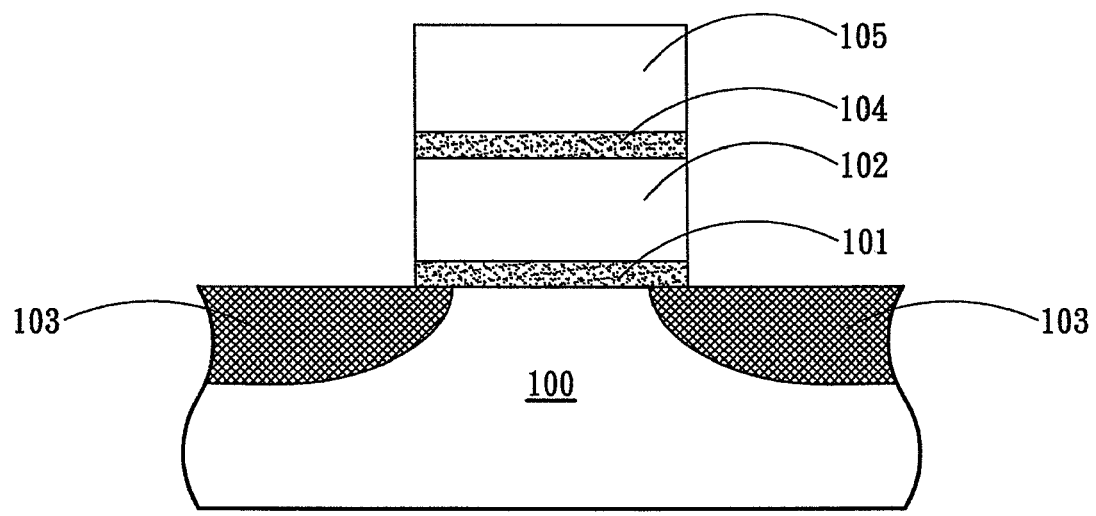
Figure 1G:
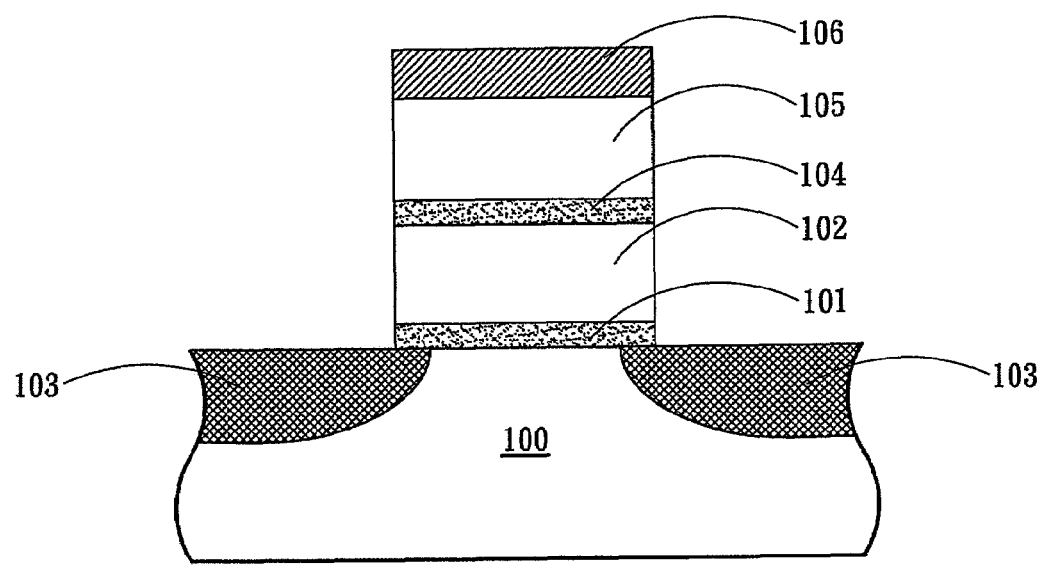
Figure 1H:
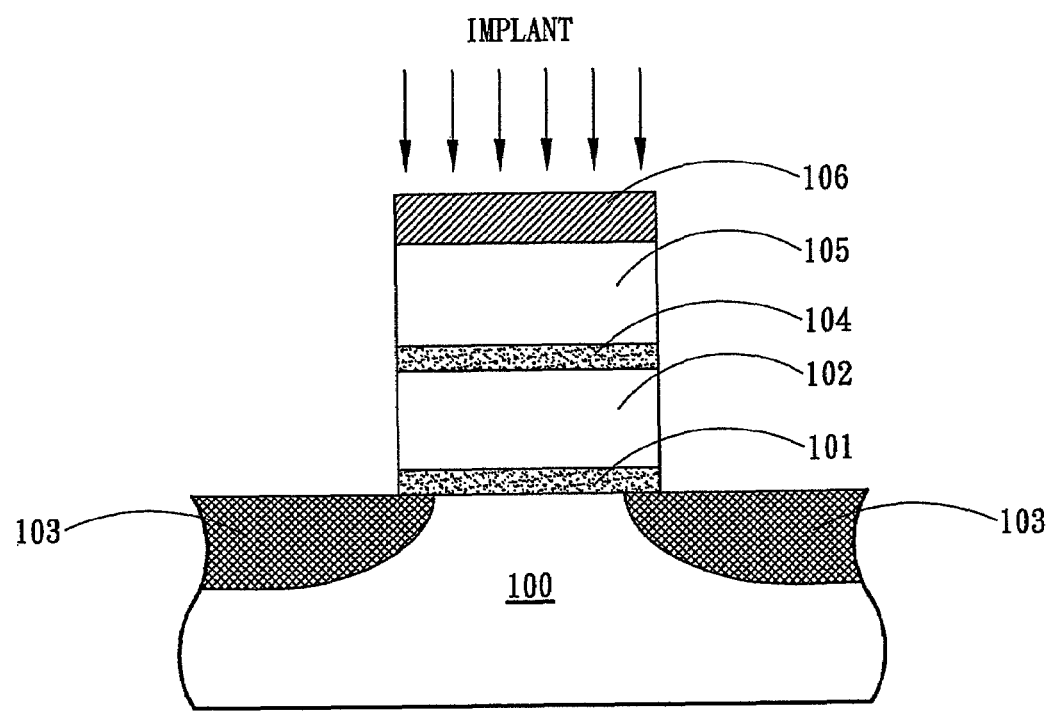

FIGS. 1A-1H illustrate an example device cross-section of forming a semiconductor memory cell comprising a wordline and a gate electrode. FIG. 1A showing a silicon substrate 100 has one or more wells (not shown) formed. FIG. 1B showing a first gate dielectric 101 is formed thereon. FIG. 1C shows that overlaying the first gate dielectric 101 is a floating-gate-poly layer 102 (poly-Si, high-dose P doped). FIG. 1D showing a source 103 and a drain region 103 are formed. FIG. 1E showing an interpoly layer 104, or a second dielectric layer 104, overlays the floating-gate-poly layer 102. FIG. 1F showing a control-gate poly layer 105 is formed on the second dielectric layer 104. FIG. 1G showing a WSix (where x can equal, for example, 1 or 2, and for clarity, will sometimes be referred to as WSi) layer 106 is formed on the control-gate poly layer 105. FIG. 1H showing a gate electrode including patterned control-gate poly layer 105 and WSix layer 106 is formed, a wordline is formed from a stacked film of the control-gate poly layer 105 and WSix layer 106, and the gate electrode is implanted. As previously discussed, the WSi layer 106 overlaying the control gate layer 105 forms a low-resistance interface between the wordline and the control-gate poly layer 105. It is noted that in this prefer embodiment, the implantation is executed after forming the WSix layer 106 on the control-gate poly layer 105. In other embodiments the implantation may be executed before forming the WSix layer 106 on the control-gate poly layer 105, that is, implanting the control-gate poly layer 105 rather than the WSix layer 106.

Figure 2:
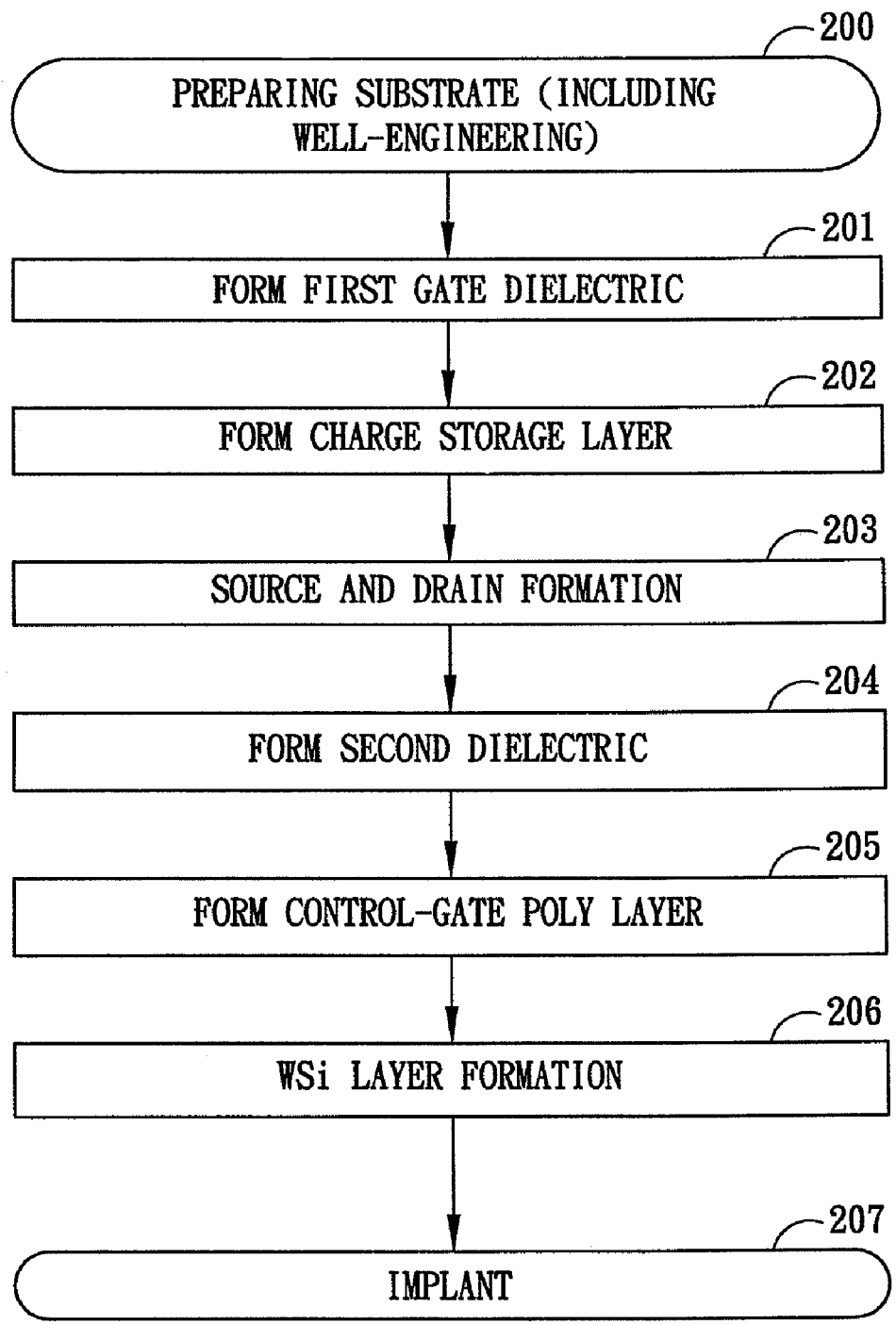
FIG. 2 illustrates an example deposition process, including the formation of a WSi layer.

FIG. 2 illustrates an example fabrication flow chart used in manufacturing a semiconductor device having reduced wordline sheet resistance, such as the device illustrated in FIG. 1. Not all of the processes need to be performed, and/or can be performed in a different order. In addition, additional processes can be performed, and different process conditions can be used.

At state 200, the substrate is prepared. By way of example, the preparation may optionally include one or more of a silicon wafer marking process, using a laser or other marking technology, well formation, and/or a thermal oxidation process to form an oxide film. At state 201 a first gate dielectric can be formed.

Next, at state 202, a charge layer is formed. At state 203 transistor source and drain formation takes place. At state 204, a second dielectric is formed. At state 205, a control gate poly layer is formed. At state 206 a WSi layer is formed, and a WSi annealing process is performed. The annealing process can utilize a variety of different annealing processes, optionally including one or more of conventional annealing using a conventional furnace, annealing using RTP (rapid thermal processing) and an RTP furnace, and or other annealing processes and furnaces. For example, the RTP annealing process can be performed at about 800° C. to 1200° C., for 5 seconds to 120 minutes. By way of further example, the annealing can be performed at a first temperature for a first period of time, then at a second temperature higher than the first temperature for a shorter period of time. Optionally, a sacrificial cap or screen is formed using an LPTEOS (low pressure tetra-ethoxysilane) deposition process [not shown]. At state 207, the WSi layer is implanted.

By way of example, the deposition process can provide a poly-Si layer within a range of about (500 Å to 2000 Å), and in one embodiment, of about 600 Å. The deposition process can provide a WSix layer within a range of about (500 Å to 2000 Å), and in one embodiment, of about 900 Å. The wordlines can be formed from a stacked film of WSix and poly-Si.

FIG. 3A is a table listing the wordline sheet resistance (Rs) as ohm/square, and reduction levels in resistance using a conventional one-step poly-Si deposition process and using the multi-step poly-Si deposition process described herein. The WF6 flow rate for this example is about 3.8 sccm. Other flow rates, such as 4.0 sccm, can be used as well. The wordlines in this example are formed from a stacked film including a 600 Å layer of P-doped poly silicon, and a 900 Å layer of WSix. The resistance measurements are taken before WSi annealing. In this example, a reduction of about 4.28% is achieved using the example two-step poly implantation process, and the wordline resistance of 74.8 ohms is reduced to 71.6 ohms. Other embodiments can provide greater or lesser reductions in wordline resistance.

FIG. 3B is a table providing the resistance (Rs), and the resistance reduction level, after annealing, as well as listing the ion implantation energy in units of KeV, and the dosage rate (expressed as ions/cm$^2$), where the specie P (phosphorous) is used. Other specie, such as nitrogen and arsenic can be used as well. The annealing in this example was performed using RTP at about 850° C., for 2 minutes, although other annealing processes, temperatures, and durations can be used as well. The WF6 flow rate of about 3.8 sccm was used, although higher or lower flow rates can be used. As shown, resistance reductions of up to 24.07% were achieved using the 2-step poly implantation process, using an implantation energy of about 70 KeV, a dose rate of about 5.5E15, and annealing. In this example, a wordline resistance of 24.1 ohms is reduced to 18.3 ohms. Other embodiments can provide greater or lesser reductions in wordline resistance. By comparison, using a conventional process with the same WF6 flow rate, implantation energy, and dose rate, a reduction of about 5.81% was achieved.

Thus, embodiments of the poly-Si and WSi films and implantation processes disclosed herein can advantageously reduce wordline sheet resistance.

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than flash memory.

What is claimed is:

1. A method of forming a memory wordline, the method comprising:
   forming a first gate dielectric;
   forming a charge storage layer on the first gate dielectric;
   forming a second dielectric layer on the charge storage layer;
   depositing a first poly-Si portion on said second dielectric layer using a first gas comprising PH$_3$ with a first PH$_3$ gas flow rate;
   depositing a second poly-Si portion on said first poly-Si portion using the first gas with a second PH$_3$ gas flow rate, wherein the second PH$_3$ gas flow rate is higher than the first PH$_3$ gas flow rate, and said first poly-Si portion and said second poly-Si portion constitute a control-gate poly layer;
   depositing a tungsten silicide layer on said control-gate poly layer with at least one silane-based and one tungsten-based gas, wherein said control-gate poly layer and tungsten silicide layer are then patterned to form a gate electrode, and a wordline is formed from a stacked film of said control-gate poly layer and tungsten silicide layer; and
   implanting said gate electrode.

2. The method as defined in claim 1, wherein the charge storage layer is a charge trapping layer.

3. The method as defined in claim 1, wherein the charge storage layer is a floating-gate-poly layer.

4. The method as defined in claim 1, wherein the first PH$_3$ gas flow rate is at least 20 sccm less than the second PH$_3$ gas flow rate.

5. The method as defined in claim 1, wherein the first PH$_3$ gas flow rate is less than the second PH$_3$ gas flow rate about 200 sccm.

6. The method as defined in claim 1, wherein the first PH$_3$ gas flow rate is less than the second PH$_3$ gas flow rate about 400 sccm.

7. The method as defined in claim 1, wherein the first gas comprising SiH4 and PH3.

8. The method as defined in claim 1, wherein implanting said gate electrode is performed using a dosage of at least 1.0E14 cm$^{-2}$.

9. The method as defined in claim 1, wherein implanting said gate electrode is performed using an ion implantation energy in the range of about 30 to 100 KeV.

10. The method as defined in claim 1, wherein implanting said gate electrode is performed using one or more of the following species: P, As, B, BF2, In, Ge, and Si.

11. The method as defined in claim 1, further comprising forming a cap on said tungsten silicide layer by using tetraethoxysilane deposition process.

12. The method as defined in claim 1, wherein the tungsten silicide layer forms a low-resistance interface between said wordline and said control-gate poly layer.

13. The method as defined in claim 1, further comprising performing an annealing process after depositing said tungsten silicide layer.

14. The method as defined in claim 13, wherein the annealing process uses rapid thermal processing.

15. The method as defined in claim 13, wherein the annealing process uses a temperature within the range about 800° C. to 1200° C.

16. The method as defined in claim 1, wherein the control-gate poly layer having a thickness within the range of 500 Å to 2000 Å.

17. The method as defined in claim 1, wherein the tungsten silicide layer has a thickness within the range of 500 Å to 2000 Å.

18. A method of depositing tungsten to form a wordline, the method comprising:
   depositing a first poly-Si portion on a semiconductor substrate by using a first gas comprising a first precursor gas with a first precursor gas flow rate;
   depositing a second poly-Si portion on said first poly-Si portion by using the first gas with a second precursor gas flow rate, wherein the second precursor flow rate is higher than the first precursor gas flow rate, and said first poly-Si portion and second poly-Si portion constitute a control-gate poly layer;
   performing a gate implantation on said control-gate poly layer using an implantation energy within the range of about 30 to 100 KeV; and
   depositing a WSix layer on said control-gate poly layer after said implantation is executed, wherein x denotes integer, and a wordline is formed from said control-gate poly layer and WSix layer.

19. The method as defined in claim 18, wherein the second precursor flow rate is at least 20 sccm greater than the first precursor flow rate.

20. The method as defined in claim 18, wherein the first gas comprises SiH4 and PH3.

21. The method as defined in claim 18, wherein said gate implantation is performed using one or more of the following species: P, As, B, BF2, In, Ge, and Si.

22. The method as defined in claim 18, wherein said WSix layer forms a low-resistance interface between said wordline and said control-gate poly layer.

23. The method as defined in claim 18, wherein the WSix layer has a thickness within the range of 500 Å to 2000 Å.

24. The method as defined in claim 18, further comprising performing an annealing process after depositing said WSix layer.

25. The method as defined in claim 18, wherein said wordline has resistance no greater than about 18.3 ohms/square.

26. The method as defined in claim 18, wherein said gate implantation using a WF6 flow rate of about 3.8 sccm.

27. A method of forming a memory wordline, the method comprising:

depositing a first poly-Si portion on a semiconductor substrate using a first gas comprising $PH_3$ with a first $PH_3$ gas flow rate;

depositing a second poly-Si portion on said first poly-Si portion using the first gas with a second $PH_3$ gas flow rate, wherein the second $PH_3$ gas flow rate is higher than the first gas flow rate, and said first poly-Si portion and said second poly-Si portion constitute a control-gate poly layer;

depositing a WSix layer on said control-gate poly layer, wherein x denotes integer, said control-gate poly layer and WSix layer are then patterned to form a gate electrode, and a wordline is formed from a stacked film of said control-gate poly layer and WSix layer; and implanting said gate electrode.

28. The method as defined in claim 27, wherein the first $PH_3$ gas flow rate is 20 sccm or more lower than the second $PH_3$ gas flow rate.

29. The method as defined in claim 27, wherein the first gas comprising SiH4 and PH3.

30. The method as defined in claim 27, wherein implanting said gate electrode is performed using a dose of at least $1.0E14$ cm$^{-2}$.

31. The method as defined in claim 27, wherein implanting said gate electrode is performed using an ion implantation energy in the range of about 30 to 100 KeV.

32. The method as defined in claim 27, wherein implanting said gate electrode is performed using one or more of the following specie species: P, As, B, BF2, In, Ge, and Si.

33. The method as defined in claim 27, wherein the WSix layer forms a low-resistance interface between said wordline said control-gate poly layer.

34. The method as defined in claim 27, wherein the WSix layer has a thickness about 900 Å.

35. The method as defined in claim 27, further comprising performing an annealing process after depositing said WSix layer.

* * * * *

UNITED STATES PATENT AND TRADEMARK OFFICE
CERTIFICATE OF CORRECTION

| | |
|---|---|
| PATENT NO. | : 7,314,796 B2 |
| APPLICATION NO. | : 11/015154 |
| DATED | : January 1, 2008 |
| INVENTOR(S) | : Liu et al. |

It is certified that error appears in the above-identified patent and that said Letters Patent is hereby corrected as shown below:

At Title Page Column 2 (Abstract), Line 4: After "deposited." delete "a".

At Title Page Column 2 (Abstract), Line 6: After "rate." delete "A".

At Title Page Column 2 (Abstract), Line 14: Delete "a" and insert -- an --, therefor.

At Column 2, Line 5: Delete "memory a" and insert -- a memory --, therefor.

At Column 2, Line 54: Delete "PH3" and insert -- $PH_3$ --, therefor.

At Column 3, Line 31: Delete "SiH4" and insert -- $SiH_4$ --, therefor.

At Column 3, Line 31: Delete "PH3" and insert -- $PH_3$ --, therefor.

At Column 3, Line 35: Delete "PH3" and insert -- $PH_3$ --, therefor.

At Column 3, Line 38: Delete "PH3" and insert -- $PH_3$ --, therefor.

At Column 3, Line 46: Delete "PH3" and insert -- $PH_3$ --, therefor.

At Column 4, Line 24: Delete "WSi" and insert -- Wsix --, therefor.

At Column 4, Line 24: Delete "overlaying" and insert -- overlying --, therefor.

At Column 6, Line 19: In Claim 7, delete "SiH4" and insert -- $SiH_4$ --, therefor.

At Column 6, Line 19: In Claim 7, delete "PH3" and insert -- $PH_3$ --, therefor.

At Column 7, Line 5: In Claim 20, delete "SiH4" and insert -- $SiH_4$ --, therefor.

At Column 7, Line 5: In Claim 20, delete "PH3" and insert -- $PH_3$ --, therefor.

UNITED STATES PATENT AND TRADEMARK OFFICE
CERTIFICATE OF CORRECTION

PATENT NO. : 7,314,796 B2
APPLICATION NO. : 11/015154
DATED : January 1, 2008
INVENTOR(S) : Liu et al.

It is certified that error appears in the above-identified patent and that said Letters Patent is hereby corrected as shown below:

At Column 8, Line 12: In Claim 29, delete "SiH4" and insert -- $SiH_4$ --, therefor.

At Column 8, Line 12: In Claim 29, delete "PH3" and insert -- $PH_3$ --, therefor.

At Column 8, Line 21: In Claim 32, after "following" delete "specie".

At Column 8, Line 24: In Claim 33, after "wordline" insert -- and --.

Signed and Sealed this

Twelfth Day of August, 2008

JON W. DUDAS
*Director of the United States Patent and Trademark Office*